United States Patent
Sonoda et al.

(10) Patent No.: US 6,544,877 B1
(45) Date of Patent: *Apr. 8, 2003

(54) METHOD OF PRODUCING THIN FILM OF ZINC OXIDE, PROCESS FOR MANUFACTURING PHOTOVOLTAIC ELEMENT USING ITS METHOD, AND PHOTOVOLTAIC ELEMENT

(75) Inventors: Yuichi Sonoda, Nara (JP); Kozo Arao, Cupertino, CA (US); Noboru Toyama, Hirakata (JP); Yusuke Miyamoto, Kyotanabe (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/447,239

(22) Filed: Nov. 23, 1999

(30) Foreign Application Priority Data

Nov. 24, 1998 (JP) .......................................... 10-332246

(51) Int. Cl.$^7$ .......................... C25D 11/00; H01L 21/44

(52) U.S. Cl. ...................... 438/609; 205/118; 205/141; 205/155; 205/333

(58) Field of Search .......................... 136/256; 205/118, 205/137, 138, 141, 153, 155, 316, 333; 257/436; 438/608, 609

(56) References Cited

U.S. PATENT DOCUMENTS

| | | | |
|---|---|---|---|
| 5,486,238 A | 1/1996 | Nakagawa et al. | 136/259 |
| 5,804,466 A | 9/1998 | Arao et al. | 438/95 |
| 5,986,204 A | 11/1999 | Iwasaki et al. | 136/256 |

FOREIGN PATENT DOCUMENTS

| | | | |
|---|---|---|---|
| JP | 04-119843 | | 4/1992 |
| JP | 8-217443 | * | 8/1996 |
| JP | 10-140373 | | 5/1998 |

OTHER PUBLICATIONS

Sannomiya, et al.; "a—SiC/aSi/a SiGe Multi–Bandgap . . . Profiling" Techn. Digest Int'l PVSEC–5, pp. 387–390 (1990).

"29p—MF–2 Optical Conferment Effect in a—SiGe Solar Cells . . . Substrates"., Ext. Abstr. 51$^{st}$ Autumn Mtg. Appl. Phys Soc. p. 747, (1990).

* cited by examiner

Primary Examiner—Olik Chaudhuri
Assistant Examiner—Marcos D. Pizarro-Crespo
(74) Attorney, Agent, or Firm—Fitzpatrick, Cella, Harper & Scinto

(57) ABSTRACT

The method of the present invention is a method of producing a thin film of zinc oxide, which comprises immersing a counter electrode and a conductive substrate as a negative electrode in an aqueous solution containing nitrate ions and 0.05 mol/liter or more of zinc ions, and passing a current between the counter electrode and the conductive substrate to electrochemically deposit zinc oxide on the conductive substrate from the aqueous solution, thereby forming a thin film of zinc oxide, wherein a film forming rate of the thin film is varied at least one time midway during an electrolytic deposition reaction for forming the thin film. The present invention can provide the following meritorious advantages: it is possible to form a texture-structured thin film effective in optical confinement in a short time by using the above electrolytic deposition method advantageous for lowering a production cost, to prevent abnormal growth of a deposited film, to have a film surface excellent in uniformity and adhesion, and to improve photoelectric characteristics and promote mass productivity by applying the present invention to the stacked structure of a photovoltaic element.

8 Claims, 5 Drawing Sheets

METHOD OF PRODUCING THIN FILM OF ZINC OXIDE, PROCESS FOR MANUFACTURING PHOTOVOLTAIC ELEMENT USING ITS METHOD, AND PHOTOVOLTAIC ELEMENT

BACKGROUND OF THE INVENTION

1. Field of the Invention

The present invention relates to a method of producing a thin film of zinc oxide which is applied to a transparent conductive layer for a stacked structure forming a photovoltaic element such as a solar cell or the like, a process for manufacturing a photovoltaic element using its method, and the photovoltaic element, in particular, to a method of producing a thin film of zinc oxide by electrochemically depositing zinc oxide from an aqueous solution to form a thin film of zinc oxide.

2. Related Background Art

Formerly, to improve the effect of collecting longer wavelengths, a photovoltaic element made of hydrogenated amorphous silicon, hydrogenated amorphous silicon germanium, hydrogenated amorphous silicon carbide, micro—or poly-crystalline silicon, or the like has a reflective layer provided on the back surface thereof. It is desirable that the reflective layer exhibits reflective characteristics effective in a range of 800 to 1200 nm, that is, wavelengths near the energy bandgap edge of a semiconductor material at which optical absorption is made smaller. A substance fully satisfying this condition includes metals such as gold, silver, copper and aluminum.

Besides, for the purpose of optical confinement, an uneven layer optically transparent in a predetermined wavelength range has been provided. The uneven layer has generally been provided between a reflective layer made of the above metal and a semiconductor active layer to effectively use a reflected light, thereby improving the short circuit current density Jsc.

Furthermore, to prevent the degradation of characteristics due to shunt pass, a thin film made of an optically transparent conductive material or a transparent conductive layer has been provided between a back surface reflective layer and a semiconductor layer.

These thin films are deposited by using a method such as vacuum evaporation method or sputtering method, whereby characteristics of solar cells improve in the short circuit current density Jsc by 1 mA/cm$^2$ or more.

In "29p-MF-2 Optical Confinement Effect in a-SiGe Solar Cells on Stainless Steel Substrates", the Extended Abstract of the 51st Autumn Meeting of the Applied Physical Society (1990 Autumn), p. 747, "P-IA-15, a-SiC/a-Si/a-SiGe Multi-Bandgap Stacked Solar Cells With Bandgap Profiling" by Sannomiya et al., Technical Digest of the International PVSEC-5, Kyoto, Japan, p. 381, 1990 and so on, for example, a reflective layer composed of silver atoms is examined about the reflectivity and the texture structure. It is concluded in these that an increase in short circuit current due to the optical confinement has been achieved by forming two deposited silver layers formed under different conditions in substrate temperature to form an effective unevenness and using the layers in combination with a zinc oxide layer to complete a reflective layer.

Transparent conductive layers used for these optical confinement layers are deposited and formed by vacuum evaporation process using resistor heating or electron beams, sputtering process, ion plating process, CVD process or the like. But, because of problems such as a high production cost of a target material or the like, a great depreciation expense of a vacuum apparatus and a low use efficiency of materials, use of these film forming techniques leads to an extremely high cost of a photovoltaic element (solar cell), thereby forming a large hindrance in industrial applications.

As countermeasures against the above problems, the present inventors have already proposed a technique for forming a thin film of zinc oxide by using a liquid deposition method, that is, an electrochemical deposition method (Japanese Patent Application Laid-Open No. 10-140373, U.S. Pat. No. 5,804,466, etc.), which can be applied as the reflective layer of a photovoltaic element (solar cell) and combined with a metal layer formed by sputtering and a transparent conductive layer.

According to this thin-film forming technique, neither an expensive vacuum apparatus nor an expensive target is required, thereby enabling the production cost of a zinc oxide film to be remarkably reduced. Besides, since the thin film can be deposited also on a larger-area substrate, this method is promising for photovoltaic element, such as solar cell, requiring a larger-area.

However, the thin-film forming technique using the above electrolytic deposition method (electrochemical deposition method) has the following problems.

(1) Only a smooth surface film is formed and there are no means for the provision of an uneven shape (texture structure) effective in optical confinement on a deposited film, for the shortening of a deposition time for the promotion of mass productivity and so on.

(2) Especially in cases of raising the current density or elevating the concentration of an aqueous solution, the abnormal growth in the shape of a needle, ball, dendrite or the like is likely to occur beyond the order of microns on a deposited film. When this thin film of zinc oxide is used as the constituent of a photovoltaic element, it is considered to allow the abnormal growth of the thin film to induce a shunt pass in a photovoltaic element.

(3) Variation is likely to occur in the size of zinc oxide crystal grains, so that there was a problem in uniformity when a larger area film is formed.

(4) The obtained thin film is inferior in adhesion to a substrate to a film formed by the vacuum evaporation process using resistor heating or electron beams, the sputtering process, the ion plating process, the CVD process or the like.

SUMMARY OF THE INVENTION

The present invention has been made in view of the above problems, and its object is to provide a method of producing a thin film of zinc oxide, which is capable of forming a thin film of texture structure effective in optical confinement for a short time and of preventing the abnormal growth of a deposited film by electrolytic deposition advantageous for lowering a production cost, which can provide a thin film of zinc oxide excellent in the uniformity and adhesion of a film surface, and which can be applied to the stacked structure of a photovoltaic element to enhance the photoelectric characteristics and raise the mass productivity; and a process for manufacturing a photovoltaic element by using the above method; and a photovoltaic element.

To achieve the above object, the method of the present invention is a method of producing a thin film of zinc oxide, which comprises immersing a counter electrode and a conductive substrate as a negative electrode in an aqueous solution containing nitrate ions and 0.05 mol/liter or more of zinc ions, and passing a current between the counter electrode and the conductive substrate to electrochemically deposit zinc oxide on the conductive substrate from the aqueous solution, thereby forming a thin film of zinc oxide, wherein a film forming rate of the thin film is varied at least one time midway during an electrolytic deposition reaction for forming the thin film.

Since there is a positive correlation between the film forming rate and the inclination of unevenness of a film surface, most of the required thickness can be initially formed at a large film forming rate and a film having a large inclination of a surface unevenness can be obtained by varying the film forming rate to be made minimum at a final stage. Thus, the formed thin film of zinc oxide has a texture structure highly effective in optical confinement.

Besides, by varying the film forming rate after the thin film of zinc oxide is deposited by 3000 Å or more, that is, when the thickness thereof is 3000 Å or more, it is preferable to form a texture structure highly effective in optical confinement, and a film having a large inclination is formed after varying the film forming rate, so that a texture structure having a large optical confinement effect is efficiently obtained in a short time.

Besides, there is a positive correlation between the current density and the film forming rate, it is preferable that the current density is varied to easily change the film forming rate.

Further, by adding saccharose or dextrine to an aqueous solution in addition to nitrate ions and zinc ions, the abnormal growth occurring in a zinc oxide layer can be remarkably controlled, and film formation can be easily carried out at high concentration, whereby a zinc oxide thin film of texture structure suitable for optical confinement can be formed. Accordingly, a highly functional (short circuit current—and conversion efficiency-improved) photovoltaic element improved in yields and excellent in adhesion can be continuously supplied stably.

Furthermore, it is preferable to previously deposit a zinc oxide thin film on a conductive substrate. At present, no technique of directly depositing a zinc oxide thin film excellent in optical characteristics on an aluminum surface has been found in the electrolytic deposition process. This is because an aluminum surface is boehmite-denatured and significantly decreases in reflecting ability under action of a hot acidic solution and the boehmite-denatured surface becomes a folded structure, thereby bringing the growth of zinc oxide into the shape of tucks or powders. Thus, by previously depositing a zinc oxide thin film on an aluminum surface, a zinc oxide thin film excellent in optical characteristics can be deposited even though aluminum is used as the metal layer. Besides, with relatively ease, a zinc oxide thin film with less abnormal growth can be formed efficiently and uniformly.

By continuously forming a zinc oxide thin film in a roll-to-roll system, the zinc oxide thin film of an uneven structure excellent in optical confinement can be produced.

DETAILED DESCRIPTION OF PREFERRED EMBODIMENTS

Hereinafter, embodiments of the present invention will be described referring to the appended drawings.

Formation of a Zinc Oxide Thin Film by Using the Electrolytic Deposition Method

Figure 2:
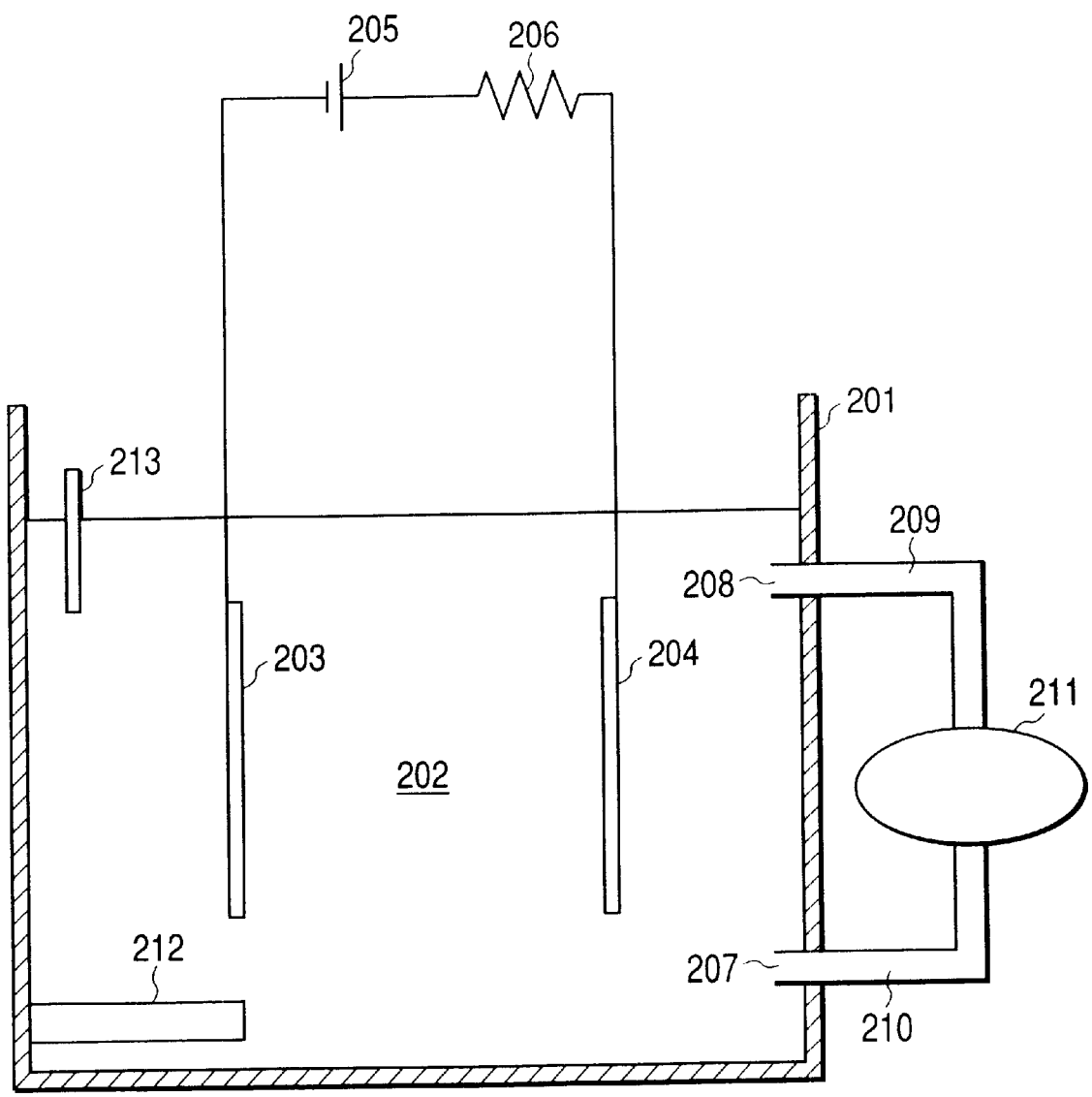
FIG. 2 is a structural representation of a production apparatus for executing the electrolytic deposition method of forming a zinc oxide thin film.

FIG. 2 is a structural representation of a production apparatus for executing the electrolytic deposition method of forming a zinc oxide thin film.

This production apparatus is constituted so as to form a thin film on the side of a substrate 203 by electrolytic deposition, in which an aqueous solution 202 for electrolytic deposition is maintained in a corrosion-resistant vessel 201 and both a substrate (conductive substrate) 203 as a negative electrode and a counter electrode 204 for a positive electrode are immersed in the aqueous solution 202. This substrate 203 is connected to the negative electrode output of an electric power source 205 and the counter electrode 204 is connected to the positive electrode output of the electric power source 205 via a load resistor 206. At the bottom of the vessel 201, a heater 212 is provided and a thermometer 213 is immersed in the aqueous solution 202.

Further, in order to stir the aqueous solution 202, this production apparatus is equipped with a solution circulation system comprising a solution suction port 208, a solution ejection port 207, a solution circulating pump 211, a solution suction pipe 209 and a solution ejection pipe 210. Incidentally, if the apparatus is small, a magnetic stirrer, a mechanical stirrer or the like can be also used.

In the aqueous solution 202, at least nitrate ions and zinc ions are contained and the concentration of zinc ions is at least 0.05 mol/liter.

Figure 7:
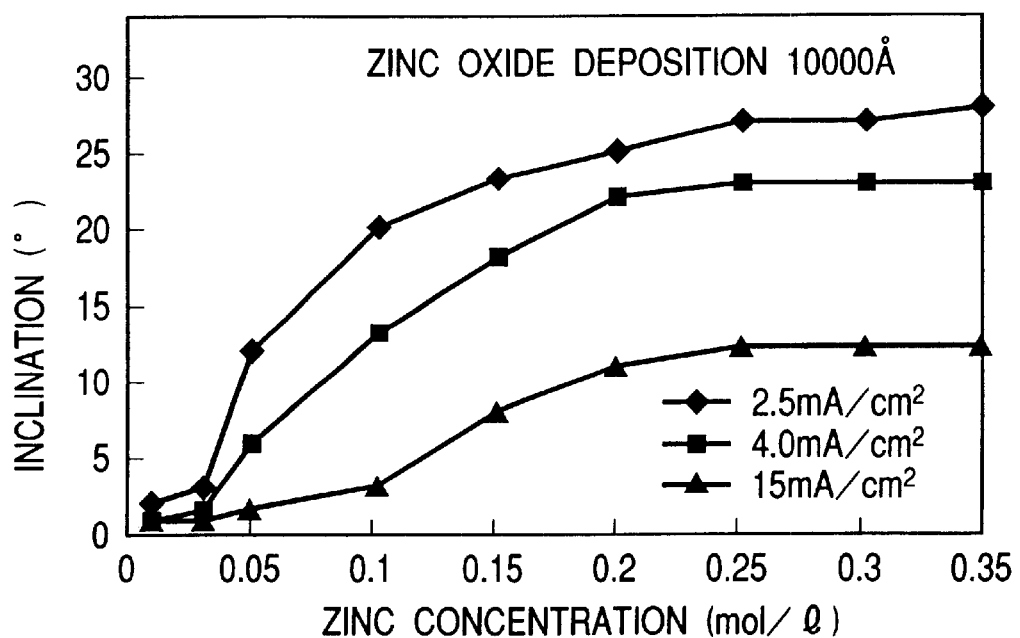
FIG. 7 is a graph showing a relation between the zinc ion concentration and the inclination, that is, the dependency of the inclination on the zinc ion concentration.

FIG. 7 is a graph showing a relationship between the zinc ion concentration and the inclination. At this time, the zinc nitrate concentration of the aqueous solution 202 was varied and zinc oxide was deposited up to a thickness of 10000 Å. Then, the measurement of the inclination was carried out in three current density cases of 2.0 A/cm$^2$, 4.0 A/cm$^2$ and 10.0 A/cm$^2$. As clearly seen from FIG. 7, the inclination is greatly raised when the zinc oxide concentrations are 0.05 mol/liter or more.

The concentration of nitrate ions is preferably in a range of 0.002 to 3.0 mol/liter, more preferably in a range of 0.01 to 1.5 mol/liter and most preferably in a range of 0.05 to 0.7 mol/liter.

Besides, when saccharose or dextrine is contained in the aqueous solution 202, these additives can make suitable the electrolytic deposition reaction to inhibit the abnormal growth of a zinc oxide thin film. Thereby, the uniformity and the adhesion of a film surface can be improved and the abnormal growth can be prevented even when the ion concentration is set to be high, so that the zinc oxide thin film of texture highly effective in optical confinement can be formed with a high yield. Accordingly, the thin film can be applied to a stacked structure of a photovoltaic element to improve photoelectric characteristics and enhance the mass productivity.

In cases where saccharose or dextrine is contained in the aqueous solution 202, the concentration of saccharose thereof is set to preferably 500 to 1 g/liter, more preferably 100 to 3 g/liter, and the concentration of dextrine thereof is set to preferably 10 to 0.01 g/liter, more preferably 1 to 0.025 g/liter.

By setting the temperature of this aqueous solution 202 to 60° C. or more, the zinc oxide thin film can be uniformly and efficiently formed with less abnormal growth.

The method of producing a zinc oxide thin film according to the present invention is characterized in that the film forming rate is varied at least one time midway during the electrolytic deposition reaction for forming the thin film. The variation manner of the film forming rate is not especially limited, but it is preferable to vary the film forming rate by changing the current density.

Figure 4:
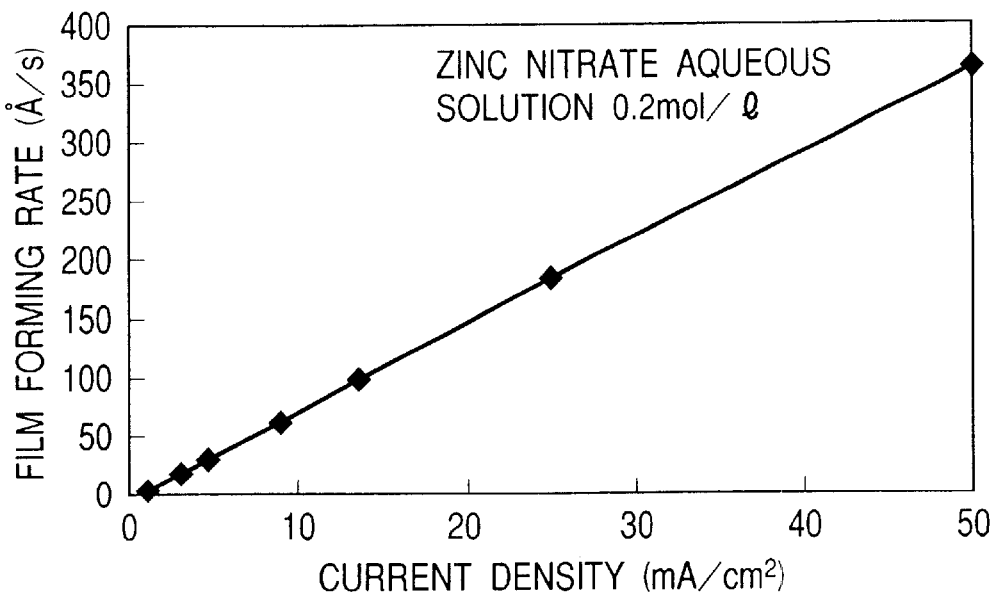
FIG. 4 is a graph showing a relationship between the current density and the film forming rate, that is, the dependency of the film forming rate on the current density.
Figure 5:
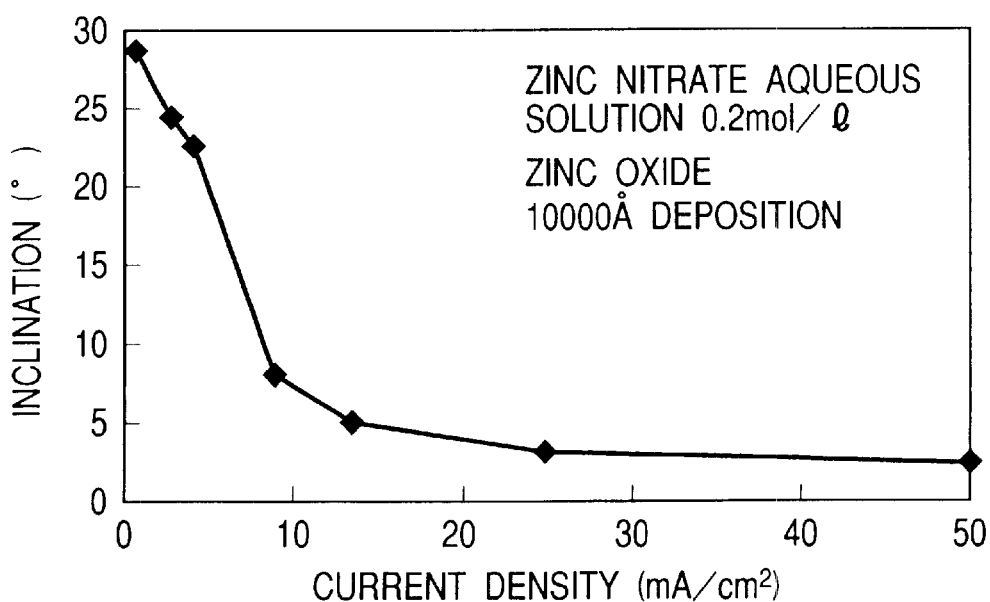
FIG. 5 is a graph showing a relationship between the current density and the inclination, that is, the dependency of the inclination on the current density.

FIG. 4 is a graph showing a relationship between the current density and the film forming rate, where 0.2 mol/liter of zinc nitrate was contained in the aqueous solution 202. Further, FIG. 5 is a graph showing a relationship between the current density and the inclination, where 0.2 mol/liter of zinc nitrate was contained in the aqueous solution 202 and zinc oxide was deposited up to a thickness of 1 $\mu$m.

As clearly seen from FIG. 4, the film forming rate is positively correlated to the current density. Besides, as evident from FIG. 5, the inclination is negatively correlated to the current density. Namely, the smaller the film forming rate becomes, the larger the inclination becomes.

Incidentally, the inclination referred to herein is an angle formed by a main surface of the substrate (base member) and the surface of a zinc oxide layer. Here, the main surface means a flat surface imaginally obtained by removing the unevenness originally existed in an actual substrate. Specifically, the inclination is obtained from arctan (df/dx), wherein dx is a sample length and df is a difference in distance between the main surface of the substrate and the surface of the zinc oxide layer.

Accordingly, it is preferable that at the initial stage of film formation, most of the required thickness is formed at a large film forming rate and the film forming rate at the final stage is set to a minimum value to make the inclination large. As a result, the formed zinc oxide thin film becomes one with a texture structure highly effective in optical confinement and the formation of a zinc oxide thin film preferable for the application to a transparent conductive layer of a photovoltaic element can be efficiently accomplished in a short time.

Specifically, an initial value of the film forming rate is set to preferably a range of 15 to 700 Å/sec, more preferably a range of 22 to 300 Å/sec and most preferably a range of 33 to 200 Å/sec. On the other hand, a film forming rate at the final stage of film formation is set so as to become smaller than the initial value, preferably in a range of 0.5 to 150 Å/sec, more preferably in a range of 4 to 110 Å/sec and most preferably in a range of 7.5 to 75 Å/sec.

Besides, an initial value of the current density is set to preferably a range of 2 to 100 mA/cm$^2$, more preferably a range of 3 to 40 mA/cm$^2$ and most preferably a range of 4.5 to 25 mA/cm$^2$. On the other hand, a current density at the final stage of film formation is set so as to become smaller than the initial value, preferably in a range of 0.1 to 20 mA/cm$^2$, more preferably in a range of 0.5 to 15 mA/cm$^2$ and most preferably in a range of 1 to 10 mA/cm$^2$.

Further, in the present invention, it is preferable to vary the film forming rate after the zinc oxide thin film is deposited by a thickness of 3000 Å or more.

Figure 6:
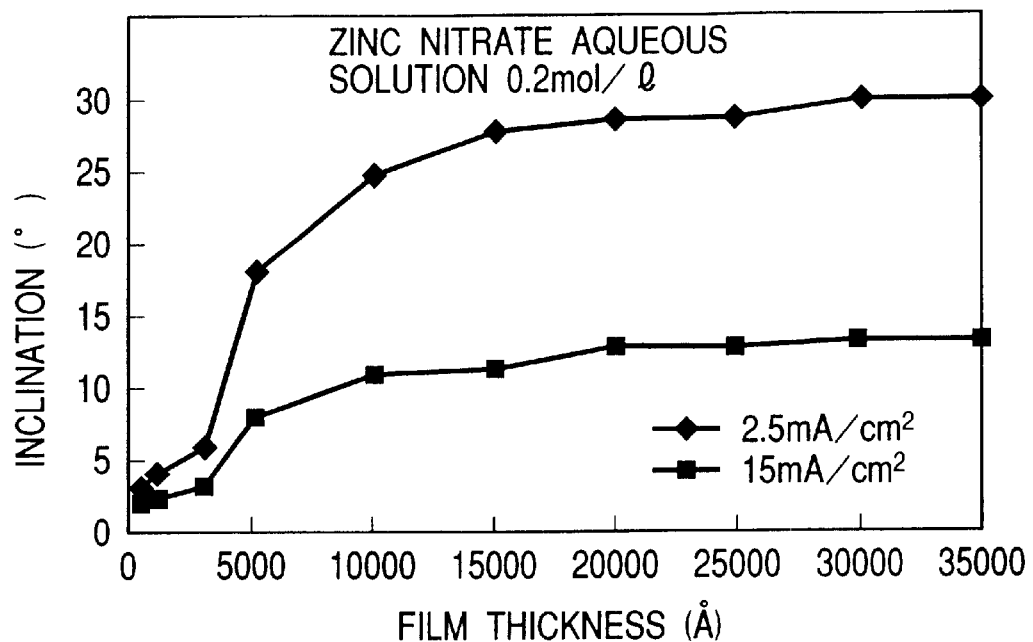
FIG. 6 is a graph showing a relationship between the thickness of a zinc oxide thin film and the inclination, that is, the dependency of the inclination on the thickness of a zinc oxide thin film.

FIG. 6 is a graph showing a relationship between the thickness of a zinc oxide film and the inclination, where 0.2 mol/liter of zinc nitrate was contained in the aqueous solution 202 and measurement of the inclination was carried out in two cases of current densities of 2.5 and 15.0 mA/cm$^2$.

As evident from FIG. 6, the film thickness is preferably 3000 Å or more in order to increase the inclination. On the other hand, when a zinc oxide thin film is too thick, sufficient optical characteristics for absorption can not be obtained. In order to fully exhibit the optical confinement effect due to the texture structure, the film thickness is preferably in a range of 3000 to 30000 Å. Accordingly, it is preferable to deposit a zinc oxide thin film up to a thickness of 3000 Å or more at a large film forming rate and then vary the film forming rate.

Besides, it has been confirmed that the surface roughness Ra is more likely to increase with increase of the thickness of a deposited film when the current density is set to be smaller, that is, when the film forming rate is set to be smaller. On the other hand, as the characteristics of a solar cell, an increase in series resistance Rs and a decrease in FF occur for too much increased surface roughness Ra. To fully exhibit the optical confinement effect due to the texture structure, the surface roughness Ra is preferably set in a range of 10 to 120 nm.

Further, as the conductive substrate, it is preferable that a substrate having a zinc oxide thin film deposited previously on the surface thereof is used. This is because it is difficult to directly deposit a zinc oxide thin film excellent in optical characteristics on the aluminum surface, for example, by using the electrolytic deposition method. That is, this is because the aluminum surface is boehmite-denatured in presence of a hot acidic solution, thereby leading to a significant decrease in reflecting ability and because growth of zinc oxide is carried out in a folded or powdery state due to a folded structure of the boehmite-denatured surface. Therefore, the previous deposition of a zinc oxide thin film on the aluminum surface before deposition of zinc oxide according to the present invention makes it possible to form a zinc oxide thin film excellent in optical characteristics even though aluminum is used as the metal layer. Besides, with relative ease, a zinc oxide thin film with less abnormal growth can be formed efficiently and uniformly.

Photovoltaic Element

Figure 1:
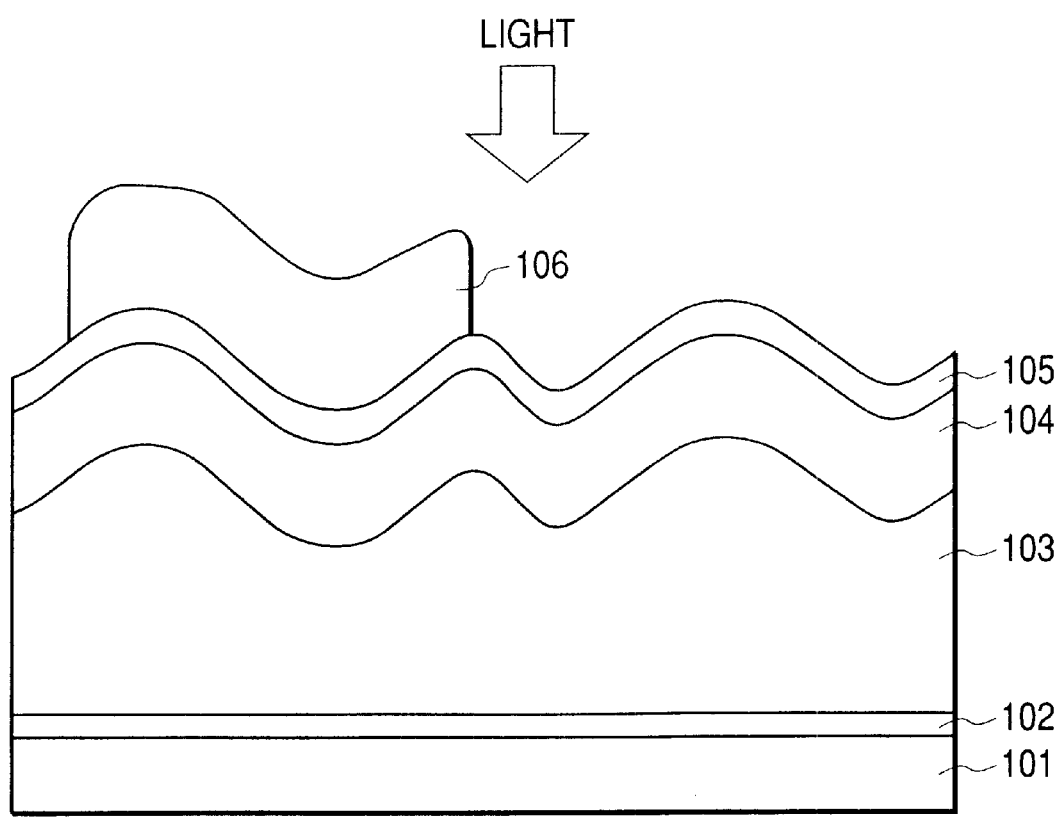
FIG. 1 is a sectional view showing the stacked structure of a photovoltaic element according to the present invention.

FIG. 1 is a sectional view showing the stacked structure of a photovoltaic element according to the present invention. The element shown in FIG. 1 is a solar cell comprising a substrate 101, a back surface reflective layer 102, a transparent conductive layer 103 made of hexagonal polycrystals, a semiconductor layer 104, a transparent electrode layer 105 and a collecting electrode 106. Incidentally, in the case of making light incident from the side of the substrate, a transparent material is employed for the substrate 101 and the other individual layers are formed in the inverse order.

Substrate

As the substrate 101, a metal layer or a member of a resin, glass, ceramics or the like coated with a conductive material is employed. This substrate 101 may also be provided with fine unevenness on its surface and may also be formed of a transparent material so that light can be made incident from the side of the stacked structure. Besides, the substrate 101 is made long and can be fed to a film forming apparatus to continuously form a film. Especially, stainless steel, polyimide or the like is preferable because of having flexibility.

Back Surface-reflective Layer

The back surface reflective layer 102 is formed by a process such as vapor deposition, sputtering, electrolytic deposition or printing method and employing Al, Cu, Ag, Au or the like as the material thereof. The back surface reflective layer functions both as an electrode in the electrolytic deposition and as a reflective layer for reflecting the light arrived at the substrate 101 to be reutilized in the semiconductor layer 104. By providing unevenness on the surface of this back surface reflective layer 102, the path of the reflected light can be extended in the semiconductor layer 104 to increase the short circuit current. Incidentally, in the case of using a substrate 101 having a high reflectivity, this back surface reflective layer 102 need not be formed.

Transparent Conductive Layer

The transparent conductive layer 103 can be formed by using the method of producing a zinc oxide thin film according to the present invention. In this transparent conductive layer 103, unevenness is preferably provided on the front surface in the same way as the back surface reflective layer 102 to increase the diffused reflection of incident and reflected light and extend the light path length in the semiconductor layer 104. Besides, the transparent conductive layer also serves to prevent elements constituting the back surface reflective layer 102 under the transparent conductive layer from diffusing into the semiconductor layer 104 to cause migration, thereby leading to the shunt of a photovoltaic element. Furthermore, by giving a moderate degree of resistance to the transparent conductive layer 103, a short circuit due to defects such as pin holes in the semiconductor layer 104 can be prevented.

Semiconductor Layer

As the material of the semiconductor layer 104, an amorphous or microcrystalline Si, C, Ge or an alloy thereof is preferably used. And, hydrogen and/or halogen atoms are preferably contained in these materials. The preferable content ranges from 0.1 to 40 atomic %. Furthermore, oxygen, nitrogen or the like may be contained therein. The impurity concentration of these is preferably $5 \times 10^{19}$ atom/cm$^{-3}$ or less. Besides, it is preferable for the pin junction that the III group elements are contained in the p-type layer and the V group elements are contained in the n-type layer.

When the layer construction of the semiconductor layer 104 is a stacked cell, the bandgaps of the i-type layers of the pin junctions are preferably broader near the light incidence side and narrower in a farther layer of the pin junction. Besides, a minimum of bandgap inside the i-type layer is preferably present a little near the p-type layer rather than at the center of the layer thickness. The doped layer on the light incidence side suitably comprises a crystalline semiconductor having a small optical absorption or a semiconductor having a broad bandgap.

To form a semiconductor 104, it is suitable to use the microwave (MW) plasma CVD process or the high-frequency (RF) CVD process. As its semiconductor deposition technique, the i-type layer comprises Graded SiGe and Ge composition is 20 to 70 atomic % (Japanese Patent Application Laid-Open No. 4-119843) and others can be employed.

Transparent Electrode

The transparent electrode layer 105 is formed by using a process such as vapor deposition, CVD, spray, spin ion and soaking processes and employing ITO (Indium Tin Oxide), ZnO, $In_2O_3$ and the like as the material, and a substance for changing the conductivity may be contained in these compounds. By appropriately setting the film thickness, this transparent electrode layer 105 can also function as an antireflection film.

Collecting Electrode

The collecting electrode 106 is provided so as to enhance the current collecting efficiency, and it is formed by a method, such as a method for forming a collecting electrode pattern of a metal by sputtering with a mask, a method for printing a conductive paste or a solder paste and a method of bonding a metal wire with a conductive paste.

Incidentally, as the photovoltaic element, a protective layer is formed on both sides thereof in some cases and at that time, a reinforcing material such as steel may be used together with the protective layer.

Hereinafter, the examples of the method of producing a zinc oxide thin film according to the present invention will be described.

EXAMPLE 1

The production apparatus shown in FIG. 2 was employed, in which a 0.12 mm thick stainless steel 430 BA copper-sputtered by the thickness of 2000 Å was used as a substrate 203 functioning as the negative electrode and a 1 mm thick 4-N zinc was used as a counter electrode 204 functioning as the positive electrode. An aqueous solution 202 was prepared by adding an aqueous solution of 500 cc containing 0.1 mol/liter of zinc nitrate and 8 cc of 60% nitric acid to a 500 cc beaker, and the solution temperature was maintained at 80° C.

The substrate 203 on the negative electrode side was connected to the ground. Current was supplied between a counter electrode 204 on the positive electrode side and a substrate 203 on the negative electrode side, first at a current density of 5.0 mA/cm$^2$ (0.5 A/dm$^2$) for one minute (38 Å/sec), then at a current density of 10.0 mA/cm$^2$ (1.0 A/dm$^2$) for 3 minutes (78 Å/sec), and finally a current density of 3.0 mA/cm$^2$ (0.3 A/dm$^2$) for 2 minutes (23 Å/sec) in this order, that is, current was supplied for 6 minutes in total.

With respect to the zinc oxide thin film obtained on a substrate 203 on the negative electrode side, the thickness was measured by using the optical interferometry from a standard wave form of optical characteristics (output wave form of Nippon Bunkou Corporation's V-570), and the inclination and the surface roughness Ra were measured by using an interatomic force microscope (Quesant Co., Q scope Model 250) on the basis of the average angle of a needle tip movement. Incidentally, such a measuring mode is normally set in an interatomic force microscope. The results are shown in Table 1.

Comparative Example 1

Except that application of current was performed at 7.0 mA/cm$^2$ (0.7 A/dm$^2$) for 6 minutes (52 Å/sec), an electrolytic deposition was carried out under the same conditions as those of Example 1 and estimated. The results are shown in Table 1.

Comparative Example 2

Except that application of current was performed at 3.0 mA/cm² (0.3 A/dm²) for 14 minutes (23 Å/sec), an electrolytic deposition was carried out under the same conditions as those of Example 1 and estimated. The results are shown in Table 1.

TABLE 1

|  | Example 1 | Comparative Example 1 | Comparative Example 2 |
|---|---|---|---|
| Deposition Time (min) | 6 | 6 | 14 |
| Thickness (Å) | 18500 | 18700 | 19000 |
| Inclination (°) | 23 | 8 | 19 |
| Ra (nm) | 45 | 30 | 185 |

As shown in Table 1, according to the present invention, the inclination can be elevated in a short time while suppressing an increase in surface roughness Ra, and by applying the formed zinc oxide thin film to the reflective layer of a photovoltaic element, photoelectric characteristics of the photovoltaic element can be improved.

EXAMPLE 2

The production apparatus shown in FIG. 2 was employed in which a 0.12 mm thick stainless steel 430 BA silver-sputtered by the thickness of 2000 Å was used as the substrate 203 functioning as the negative electrode and a 1 mm thick 4-N zinc was used as the counter electrode 204 functioning as the positive electrode. As the aqueous solution 202, an aqueous solution containing 0.2 mol/liter of zinc nitrate was employed and the solution temperature was maintained at 80° C.

The substrate 203 on the negative electrode side was connected to the ground. Current was supplied between the counter electrode 204 on the positive electrode side and the substrate 203 on the negative electrode side, first at a current density of 15.0 mA/cm² (0.5 A/dm²) for 3 minutes (110 Å/sec), and then at a current density of 4.0 mA/cm² (0.4 A/dm²) for 3 minutes (30 ÅA/sec) in this order, that is, current was supplied for 6 minutes in total.

With respect to the zinc oxide film obtained on a substrate 203 on the negative electrode side, the number of abnormal growth was counted on visual observation within the area of 3 cm×3 cm. Furthermore, on the observation using an SEM (Hitachi, Ltd.'s S-4500), the number of abnormal growth was counted within the area of 10 mm×10 mm. Besides, the whole substrate 203 was subjected to a bending-peeling off test. The results are shown in Table 2.

EXAMPLE 3

Except that the aqueous solution 202 was prepared by adding 12 g/liter of saccharose to an aqueous solution containing 0.2 mol/liter of zinc acetate, an electrolytic deposition was carried out under the same conditions as those of Example 2 and estimated. The results are shown in Table 2.

EXAMPLE 4

Except that the aqueous solution 202 was prepared by adding dextrine at a rate of 0.1 g/liter to an aqueous solution containing 0.2 mol/liter of zinc nitrate and the solution temperature was maintained at 85° C., an electrolytic deposition was carried out under the same conditions as those of Example 2 and estimated. The results are shown in Table 2.

EXAMPLE 5

Except that a 0.12 mm thick stainless steel 430 BA silver-sputtered by the thickness of 2000 Å and further ZnO-sputtered by the thickness of 1000 Å was employed as the substrate 203 on the negative electrode side, an electrolytic deposition was carried out under the same conditions as those of Example 2 and estimated. The results are shown in Table 2.

TABLE 2

|  | Example 2 | Example 3 | Example 4 | Example 5 |
|---|---|---|---|---|
| Number of Abnormal Growth (vis. obs.) | 530 | 0 | 0 | 0 |
| Number of Abnormal Growth (SEM) | 1120 | 18 | 15 | 1 |
| (180°) Bending Test | Peeling off began at the bent portion and was almost completed after the return of bending. | There was no peeling off but a crack on the order of 0.3 mm. | There was no peeling off but a crack on the order of 0.4 mm. | Absence of peeling off or crack. |

As shown in Table 2, by the addition of saccharose or dextrine like Example 3 or 4, the abnormal growths can be greatly reduced and the adhesion of the zinc oxide thin film can be improved. And, by depositing a ZnO layer on the substrate surface on which the electrolytic deposition is carried out like Example 5, the adhesion of a zinc oxide film can be further promoted.

EXAMPLE 6

The production apparatus shown in FIG. 2 was employed in which a 0.12 mm thick stainless steel 430 (2D) aluminum-sputtered by the thickness of 1000 Å and further ZnO-sputtered by the thickness of 2000 Å was used as the substrate 203 on the negative electrode side and a 1 mm thick 4-N zinc was used as the counter electrode 204 on the positive electrode side. The aqueous solution 202 was prepared by adding dextrine at a rate of 0.05 g/liter to an aqueous solution containing 0.22 mol/liter of zinc nitrate, and the solution temperature was maintained at 75° C. The substrate 203 on the negative electrode side was connected to the ground. Current was supplied between the counter electrode 204 on the positive electrode side and the substrate 203 on the negative electrode side, where the current density was adjusted to an initial value of 9.0 mA/cm² (0.9 A/dm²) (66 Å/sec) to deposit zinc oxide thin films at the respective thicknesses of 1000, 2000, 3000, 5000, 10000 and 20000 Å, respectively, and then changed to carry out deposition at 3.0 mA/cm² (0.3 A/dm²) for 6 minutes (22 Å/sec) (approx. 8000 Å).

With respect to the zinc oxide thin film obtained on the substrate 203 on the negative electrode side, both the inclination and the surface roughness Ra were measured by using the interatomic force microscope in the same manner as of Example 1. The results are shown in Table 3.

Comparative Example 3

Except that the supply of current was performed at 3.0 mA/cm² (0.3 A/dm²) for 6 minutes (22 Å/sec) (approx. 8000 Å), an electrolytic deposition was carried out under the same conditions as those of Example 6 and estimated. The results are shown in Table 3.

TABLE 3

|  | Example 6 | | | | | | Comparative Example 3 |
| --- | --- | --- | --- | --- | --- | --- | --- |
|  | 1000 Å | 2000 Å | 3000 Å | 5000 Å | 10000 Å | 20000 Å |  |
| Inclination (°) | 24.5 | 25 | 29 | 35 | 38 | 37 | 22 |
| Ra (nm) | 67 | 70 | 72 | 78 | 93 | 105 | 65 |

As shown in Table 3, by employing a ZnO layer for the underlying surface on which a zinc oxide thin film is formed similarly to Example 6, a zinc oxide thin film can be deposited on a substrate 203 of aluminum by using the electrolytic deposition method. And, by depositing the thin film by 3000 Å or more at a large film forming rate according to the initial current density value, the inclination can be elevated while suppressing an increase in surface roughness Ra in a short time. Accordingly, by applying the zinc oxide thin film to the reflective layer of a photovoltaic element, its photoelectric characteristics can be improved.

EXAMPLE 7

By using the production apparatus shown in FIG. 2, first, an electrolytic deposition was carried out under the same conditions as of Example 2. Namely, a 0.12 mm thick stainless steel 430 BA silver-sputtered by a thickness of 2000 Å was employed as the substrate 203 on the negative electrode side and a 1 mm thick 4-N zinc was employed as the counter electrode 204 on the positive electrode side. As the aqueous solution 202, an aqueous solution containing 0.2 mol/liter of zinc nitrate was employed, and the solution temperature was maintained at 80° C. The substrate 203 on the negative electrode side was connected to the ground. Current was supplied between the counter electrode 204 on the positive electrode side and the substrate 203 on the negative electrode side, first at a current density of 15.0 mA/cm$^2$ (1.5 A/dm$^2$) for 3 minutes (90 Å/sec), and then at a current density of 4.0 mA/cm$^2$ (0.4 A/dm$^2$) for 3 minutes (28 Å/sec) in this order, that is, current was supplied for 6 minutes in total.

Thereafter, as the semiconductor layer 104, an n-type amorphous silicon (a-Si) was deposited by a thickness of 200 Å, a non-doped amorphous silicon (a-Si) was deposited by a thickness of 2000 Å and a p-type microcrystalline silicon (pc-Si) was deposited by a thickness of 140 Å in this order by using the CVD method. Furthermore, ITO was deposited by a thickness of 650 Å in the atmosphere of oxygen by the heating vapor deposition to form a transparent electrode layer 105 as the upper electrode having an anti-reflection effect. Thereon, a grid made of silver was deposited by the heating vapor deposition to form a collecting electrode layer 106. Thereby, a photovoltaic element was produced.

With respect to this photovoltaic element, the short circuit current density and the conversion efficiency were measured by using a solar simulator (AM 1.5, 100 mW/cm$^2$ and surface temperature: 25° C.). The results are shown in Table 4.

Comparative Example 4

Except that the supply of current was performed at 7.0 mA/cm$^2$ (0.7 A/dm$^2$) for 6 minutes (41 Å/sec), an electrolytic deposition was carried out under the same conditions as those of Example 7, further individual layers were formed to produce a photovoltaic element. The produced photovoltaic element was estimated. The results are shown in Table 4.

TABLE 4

|  | Example 7 | Comparative Example 4 |
| --- | --- | --- |
| Short Circuit Current (%) (comparison relative to Comparative Example 4) | 1.15 | 1 |
| Conversion Efficiency (%) (comparison relative to Comparative Example 4) | 1.14 | 1 |

As shown in Table 4, by applying the zinc oxide film of the present invention to a transparent conductive layer of a photovoltaic element as of Example 7, with respect to the photovoltaic element, the short circuit current and the conversion efficiency can be improved.

EXAMPLE 8

The production apparatus shown in FIG. 2 was used. An electrolytic deposition was carried out under the same conditions as of Example 7. In the same manner as of Example 7, a photovoltaic element was produced.

With respect to this photovoltaic element, the short circuit current density and the conversion efficiency were measured similarly to Example 7. Furthermore, this photovoltaic element was allowed to stand under environments at a temperature of 85° C. and a humidity of 85% for 1000 hr, and the lowering ratio of conversion efficiency was measured. The results are shown in Table 5.

EXAMPLE 9

Except that the aqueous solution 202 was prepared by adding dextrine at a ratio of 0.5 g/liter to an aqueous solution containing 0.2 mol/liter of zinc nitrate, an electrolytic deposition was carried out under the same conditions as those of Example 8 to produce a photovoltaic element. The produced photovoltaic element was estimated. The results are shown in Table 5.

EXAMPLE 10

Except that a 0.12 mm thick stainless steel 430 BA silver-sputtered by the thickness of 2000 Å and further ZnO-sputtered by the thickness of 1000 Å was employed as the substrate 203 on the negative electrode side, an electrolytic deposition was carried out under the same conditions as those of Example 9 to produce a photovoltaic element. The produced photovoltaic element was estimated. The results are shown in Table 5.

TABLE 5

|  | Example 8 | Example 9 | Example 10 |
| --- | --- | --- | --- |
| Short Circuit Current (%) (comparison relative to Example 8) | 1 | 0.99 | 1.02 |
| Conversion Efficiency (%) (comparison relative to Example 8) | 1 | 1 | 1.01 |
| Lowering Ratio of Conversion Efficiency by HH Test (%) | 15 | 5 | 2 |

As shown in Table 5, by applying a zinc oxide film according to the present invention to the transparent conductive layer of a photovoltaic element, with respect to the photovoltaic element, the short circuit current and the conversion efficiency can be improved, the degradation ratio of conversion efficiency can be suppressed low and an improvement in reliability can be attained.

EXAMPLE 11

Except that a 0.12 mm thick stainless steel 430 BA aluminum-sputtered by a thickness of 2000 Å and further ZnO-sputtered by a thickness of 1000 Å was employed as the substrate 203 on the negative electrode side, an electrolytic deposition was carried out under the same conditions as those of Example 9, by using the production apparatus shown in FIG. 2, to produce a photovoltaic element. The produced photovoltaic element was estimated. The results are shown in Table 6.

EXAMPLE 12

Figure 3:
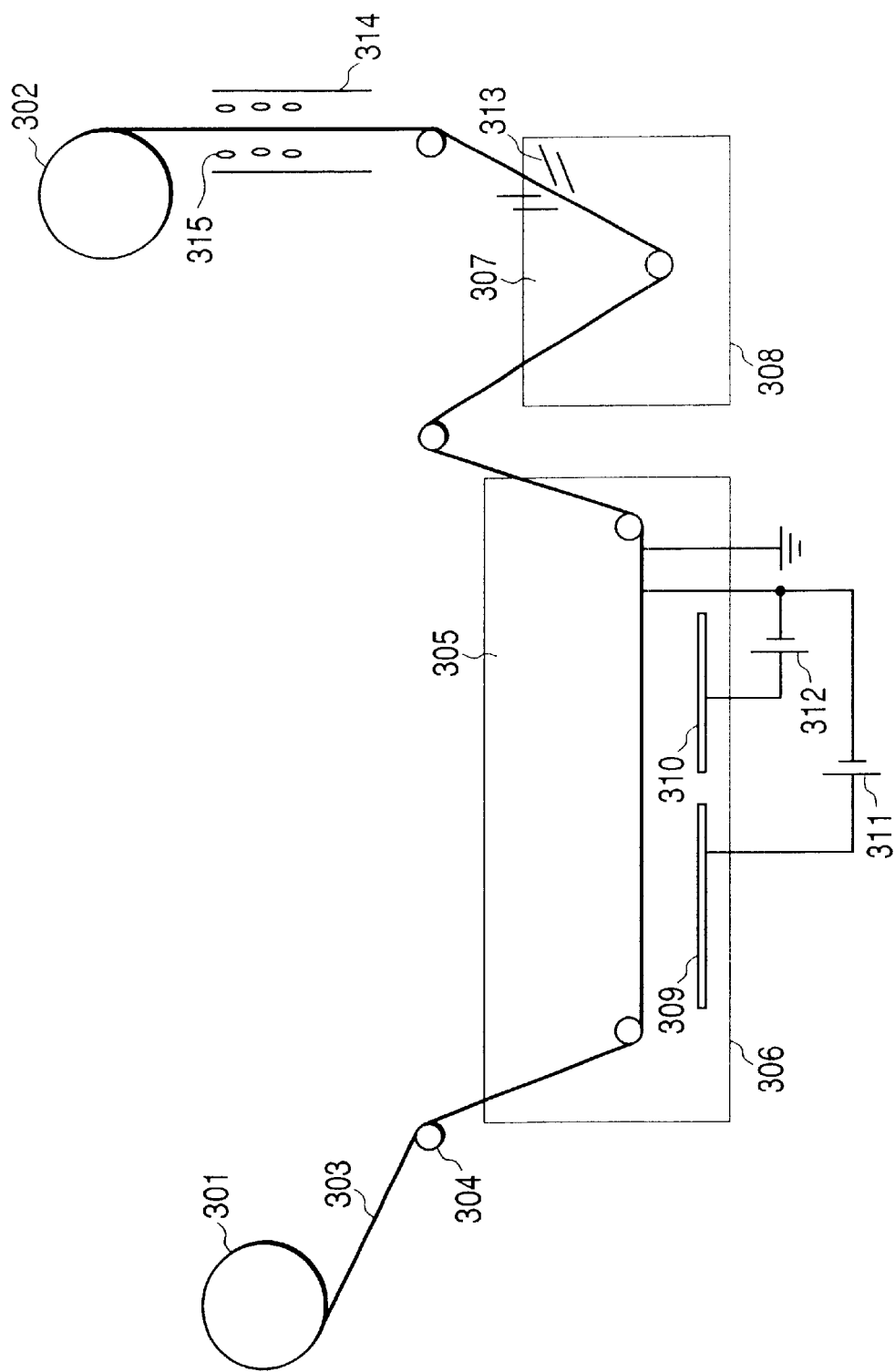
FIG. 3 is a structural representation of a production apparatus for executing the electrolytic deposition method of forming a zinc oxide thin film.

FIG. 3 is a structural representation of a roll-to-roll type apparatus for executing the electrolytic deposition. This apparatus is an apparatus for carrying out a production in the industrial production level, and the structure shown in FIG. 3 is a partial structure of the apparatus for manufacturing a photovoltaic element and shows a functional part for forming a zinc oxide thin film on a long substrate 303 by using the electrolytic deposition method.

The long substrate 303 of SUS 430 BA is wound in a roll-shaped state. On the surface of the substrate, aluminum is previously deposited by a thickness of 2000 Å as a back surface reflective layer 102 by using a corresponding roll-to-roll type DC magnetron sputtering apparatus and further ZnO is deposited thereon by a thickness of 1000 Å by using a similar corresponding roll-to-roll type DC magnetron sputtering apparatus.

The production apparatus shown in FIG. 3 is arranged so as to set a long substrate 303 wound in a roll-shaped state on a feed roller 301, pass it through a zinc oxide forming bath 306, a water washing bath 308 and a drying furnace 314 and rewind it around a winding roller 302, and therefore is called a roll-to-roll type apparatus for this reason. Incidentally, a washing water 307 is held in the water washing bath 308, a water washing shower 313 is provided on the side of its outlet and an IR heater 315 is provided inside the drying furnace 314.

Example 12 was a trial experiment using the roll-to-roll apparatus shown in FIG. 3, in which a zinc oxide thin film was formed by using the electrolytic deposition method on the long substrate 303 with an underlying layer previously formed as mentioned above.

Namely, the long substrate 303 is conveyed from the feed roller 301 to the zinc oxide forming bath 306 via the conveying roller 304. The zinc oxide forming solution 305 held in the zinc oxide forming bath 306 and composed of 70 g of zinc nitrate 6-hydrated (0.2 mol/liter) and 0.5 g of dextrine contained in 1 liter of water. The solution is subjected to solution circulation processing by means not shown in the drawings to stir the solution. This zinc oxide forming solution 305 has its temperature kept at 80° C. and its pH kept in a range of 4.0 to 6.0.

On the bottom side of the zinc oxide forming bath 306, counter electrodes 309 and 310 are disposed, zinc (600 cm×50 cm) with the surface buffed is employed for these counter electrodes 309 and 310 and the positive electrode sides of the electric sources 311 and 312 are connected to both of them, respectively.

The long substrate 303 was connected to the ground as an electrode on the negative electrode side. Current was supplied between the counter electrodes 309 and 310 on the positive electrode side and the long substrate 303 on the negative electrode side and adjusted respectively at a current density of 15.0 mA/cm$^2$ (1.5 A/dm$^2$) (92 Å/sec) and then at a current density of 4.0 mA/cm$^2$ (0.4 A/dm$^2$) (29 Å/sec) to carry out electrolytic deposition.

The conveying rate of the long substrate 303 was 2000 mm/min and a 2.5 micron zinc oxide thin film was formed.

Thereafter, the semiconductor layer 104 was formed in a triple structure by using a corresponding roll-to-roll type CVD apparatus. For this purpose, first, the surface of the long substrate 303, i.e., the surface of the transparent conductive layer 103 made of a zinc oxide thin, was heated to 340° C. in the atmosphere of a gas mixture comprising silane, phosphine and hydrogen to form an n-type layer thereon under action of 400W RF power, then an i-type layer was formed at a substrate temperature of 450° C. in the atmosphere of a gas mixture comprising silane, germanium and hydrogen under action of microwave power and further a p-type layer was formed from a gas mixture comprising boron trifluoride, silane and hydrogen at a substrate temperature of 250° C. to produce a pin junction of the bottom layer. Subsequently, according to a similar procedure at an increased mixing ratio of silane and germanium in the i-type layer, a nip junction of the middle layer was formed and further an i-type layer was deposited from silane and hydrogen according to a similar procedure to form a pin junction of the top layer. Next, ITO was deposited as a transparent conductive layer 105 by using a corresponding roll-to-roll type sputter apparatus and further a collecting electrode 106 was formed by using a silver paste to produce a photovoltaic element.

With respect to this photovoltaic element, estimation was carried out in the same manner as of Example 11. The results are shown in Table 6.

TABLE 6

|  | Example 11 | Example 12 |
| --- | --- | --- |
| Short Circuit Current (%) (comparison relative to Example 11) | 1 | 0.97 |
| Conversion Efficiency (%) (comparison relative to Example 11) | 1 | 0.98 |
| Lowering Ratio of Conversion Efficiency by HH Test (%) | 3 | 2 |

Also in the roll-to-roll type apparatus, as shown in Table 6, by applying a zinc oxide thin film according to the present invention to the transparent conductive layer of a photovoltaic element, the short circuit current and the conversion efficiency of the photovoltaic element can be improved, the degradation ratio of the conversion efficiency of the photovoltaic element can be suppressed in a low level and the reliability of the photovoltaic element can be enhanced.

According to the present invention, as described above, a zinc oxide thin film having an uneven structure effective for the optical confinement can be continuously formed.

The technique of the present invention for forming a zinc oxide film is applied as a back surface reflective layer to the solar cell manufacturing process, thereby increasing the short circuit current density and the conversion efficiency of solar cells and further improving the yield property and the durability. Besides, this technique can contribute to the full-out spread of photovoltaic power generation because of being greatly advantageous in material cost and running cost (below about a hundredth cost) in comparison with the sputtering process and the vapor deposition process.

What is claimed is:

1. A method of producing a thin film of zinc oxide, which comprises immersing a counter electrode and a conductive substrate as a negative electrode in an aqueous solution containing nitrate ions and 0.05 mol/liter or more of zinc ions, and passing a current between the counter electrode and the conductive substrate to electrochemically deposit zinc oxide on the conductive substrate from the aqueous solution, thereby forming a thin film of zinc oxide, wherein a film forming rate of the thin film is varied at least one time midway during an electrolytic deposition reaction for forming the thin film without changing the aqueous solution.

2. The method according to claim 1, wherein the film forming rate of the thin film is varied at least one time after the thin film of zinc oxide is deposited to a thickness of 3000 Å or more during the electrolytic deposition reaction for forming the thin film.

3. The method according to claim 1, wherein the film forming rate is made minimum at a final stage of the electrolytic deposition reaction for forming the thin film.

4. The method according to claim 1, wherein the film forming rate is varied by changing a density of the applied current.

5. The method according to claim 1, wherein the aqueous solution contains saccharose or dextrine.

6. The method according to claim 1, wherein a conductive substrate having a thin film of zinc oxide previously deposited thereon is used as the conductive substrate.

7. The method according to claim 1, wherein the thin film of zinc oxide is continuously formed in a roll-to-roll system.

8. A process for manufacturing a photovoltaic element, which comprises the steps of: producing a transparent conductive layer comprising a thin film of zinc oxide by using the method as set forth in any one of claims 1 to 7; and producing a semiconductor layer on the transparent conductive layer.

* * * * *

UNITED STATES PATENT AND TRADEMARK OFFICE
CERTIFICATE OF CORRECTION

PATENT NO. : 6,544,877 B1
DATED : April 8, 2003
INVENTOR(S) : Yuichi Sonoda et al.

It is certified that error appears in the above-identified patent and that said Letters Patent is hereby corrected as shown below:

Column 1,
Line 25, "micro—or" should read -- micro- or --.

Column 5,
Line 66, "mA/cm$^{2,}$" should read -- mA/cm$^2$, --.

Column 7,
Line 49, "atom/cm-$^3$" should read -- atom/cm$^{-3}$ --.

Column 9,
Line 41, "ÅA/sec)" should read -- Å/sec) --.

Column 11,
Line 49, "(pc-si)" should read -- (μc-si) --.

Signed and Sealed this

Thirtieth Day of December, 2003

JAMES E. ROGAN
*Director of the United States Patent and Trademark Office*